(12) United States Patent
Lee

(10) Patent No.: US 10,192,898 B2
(45) Date of Patent: Jan. 29, 2019

(54) DISPLAY DEVICE INCLUDING HYBRID TYPES OF TRANSISTORS

(71) Applicant: InnoLux Corporation, Miao-Li County (TW)

(72) Inventor: Kuanfeng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/460,331

(22) Filed: Mar. 16, 2017

(65) Prior Publication Data

US 2017/0294460 A1  Oct. 12, 2017

Related U.S. Application Data

(60) Provisional application No. 62/319,965, filed on Apr. 8, 2016.

(30) Foreign Application Priority Data

Jun. 15, 2016  (TW) .............................. 105118719 A

(51) Int. Cl.
*H01L 27/12* (2006.01)

(52) U.S. Cl.
CPC ........ *H01L 27/1251* (2013.01); *H01L 27/124* (2013.01); *H01L 27/1225* (2013.01); *H01L 27/1237* (2013.01)

(58) Field of Classification Search
None
See application file for complete search history.

(56) References Cited

U.S. PATENT DOCUMENTS

| | | | | |
|---|---|---|---|---|
| 8,120,037 B2* | 2/2012 | Liu | ..................... | H01L 27/1255 257/72 |
| 2005/0170565 A1* | 8/2005 | Fujii | ...................... | H01L 27/12 438/149 |
| 2007/0237407 A1* | 10/2007 | Hashido | ............... | G09G 3/3688 382/233 |
| 2009/0302319 A1* | 12/2009 | Cho | .................... | H01L 27/1214 257/59 |
| 2011/0042693 A1* | 2/2011 | Tada | ................... | H01L 21/8221 257/88 |

* cited by examiner

*Primary Examiner* — Bilkis Jahan
(74) *Attorney, Agent, or Firm* — Bacon & Thomas, PLLC

(57) ABSTRACT

A display device includes a substrate; a gate insulating layer disposed on the substrate, a first gate electrode and a second gate electrode; a first active layer disposed on the gate insulating layer and comprising a polysilicon layer; a first insulating layer disposed on the first active layer and the gate insulating layer; a second active layer disposed on the first insulating layer and comprising a metal oxide layer; a first source electrode, a first drain electrode, a second source electrode and a second drain electrode, wherein the first source electrode and the first drain electrode are disposed on the first insulating layer and respectively electrically connect to the first active layer, and the second source electrode and the second drain electrode are disposed on the second active layer and electrically connect to the second active layer; and a display medium layer disposed on the substrate.

17 Claims, 13 Drawing Sheets

DISPLAY DEVICE INCLUDING HYBRID TYPES OF TRANSISTORS

CROSS REFERENCE TO RELATED APPLICATION

This application claims the benefit of filing date of U.S. Provisional Application Ser. No. 62/319,965, filed Apr. 8, 2016 under 35 USC § 119(e)(1).

This application claims the benefits of the Taiwan Patent Application Ser. No. 105118719, filed on Jun. 15, 2016, the subject matter of which is incorporated herein by reference.

BACKGROUND

1. Field of the Disclosure

The present disclosure relates to a display device, and more particularly to a display device that contains different types of transistors with active layers respectively comprising different semiconductor materials.

2. Description of Related Art

With the continuous progress of display technology, the current trend is to make display panels as compact, thin and light as possible. Thin displays, such as liquid crystal display panels, organic light-emitting diode display panels or inorganic light-emitting diode display panels, have become dominant in the market instead of the predecessors based on cathode ray tubes. Thin displays are extensively applicable. For example, mobile phones, laptop computers, video cameras, cameras, music players, mobile navigators and TV sets are just a few devices that use such a display panel.

Liquid crystal display devices or organic light-emitting diode display devices have been popular in the market, and liquid crystal display devices are particularly well developed. However, increasing requirements of consumers to display quality of display devices, almost every dealer in this industry is investing in improving display quality. Therein, in addition to the transistor in the display region, the transistor used in the driving circuit of the gate electrode in the non-display region is also a factor having influence on the overall efficiency of a display device.

If types of transistors used in the display region and the driving circuit of the gate electrode are different, complexity of the overall manufacturing process of the display device is increased (such as requiring increased repetitions of chemical vapor deposition). In view of this, the transistors used in the display region and the driving circuit of the gate electrode need to be structurally improved so as to simplify the manufacturing processes and configurations without compromising desired propertied of transistors.

SUMMARY

A primary objective of the present disclosure is to provide a display device that contains different types of transistors with active layers respectively comprising different semiconductor material.

In one aspect of the present disclosure, the display device may comprise: a substrate; a first gate electrode and a second gate electrode disposed on the substrate; a gate insulating layer disposed on the substrate, the first gate electrode and the second gate electrode; a first active layer disposed on the gate insulating layer and corresponding to the first gate electrode, wherein the first active layer comprises a polysilicon layer; a first insulating layer disposed on the first active layer and the gate insulating layer; a second active layer disposed on the first insulating layer and corresponding to the second gate electrode, wherein the second active layer comprises a metal oxide layer; a first source electrode, a first drain electrode, a second source electrode, and a second drain electrode, wherein the first source electrode and the first drain electrode are disposed on the first insulating layer and electrically connect to the first active layer, and the second source electrode and the second drain electrode are disposed on the second active layer and electrically connect to the second active layer; in which the first gate electrode, the gate insulating layer, the first active layer, the first insulating layer, the first source electrode, and the first drain electrode form a first transistor, while the second gate electrode, the gate insulating layer, the first insulating layer, the second active layer, the second source electrode, and the second drain electrode form a second transistor; and a display medium layer disposed on the substrate.

In another aspect of the present disclosure, the display device may comprise a substrate; a first gate electrode disposed on the substrate; a gate insulating layer disposed on the substrate and the first gate electrode; a first active layer disposed on the gate insulating layer and corresponding to the first gate electrode, wherein the first active layer comprises a polysilicon layer; a second gate electrode disposed on the gate insulating layer; a first insulating layer disposed on the first active layer and the second gate electrode; a second active layer disposed on the first insulating layer and corresponding to the second gate electrode, wherein the second active layer comprises a metal oxide layer; a first source electrode, a first drain electrode, a second source electrode, and a second drain electrode, wherein the first source electrode and the first drain electrode are disposed on the first insulating layer and electrically connect to the first active layer through a plurality of vias, while the second source electrode and the second drain electrode are disposed on the second active layer and electrically connect to the second active layer; wherein the first gate electrode, the gate insulating layer, the first active layer, the first insulating layer, the first source electrode, and the first drain electrode form a first transistor, while the second gate electrode, the first insulating layer, the second active layer, the second source electrode, and the second drain electrode form a second transistor; and a display medium layer disposed on the substrate.

As stated previously, the disclosed display device comprises both the first transistor whose first active layer is a polysilicon layer and the second transistor whose second active layer is a metal oxide layer. Particularly, by adjusting the first and second active layers and the interlayer relation between the gate insulating layer and the first insulating layer, the elements of the substrate can be structurally simplified, and formation of the first and second transistors can be also simplified without compromising the desired properties of the first and second transistors.

Other objects, advantages, and novel features of the present disclosure will become more apparent from the following detailed description when taken in conjunction with the accompanying drawings.

DETAILED DESCRIPTION OF THE EMBODIMENT

The following Embodiments when read with the accompanying drawings are made to clearly exhibit the above-mentioned and other technical contents, features and effects of the present disclosure. Through the exposition by means of the specific Embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any preceding ordinals, nor that sequence between one claimed element and another claimed element or between steps of a manufacturing method. The use of these ordinals is merely to differentiate one claimed element having a certain designation from another claimed element having the same designation.

Embodiment 1

Figure 1A:
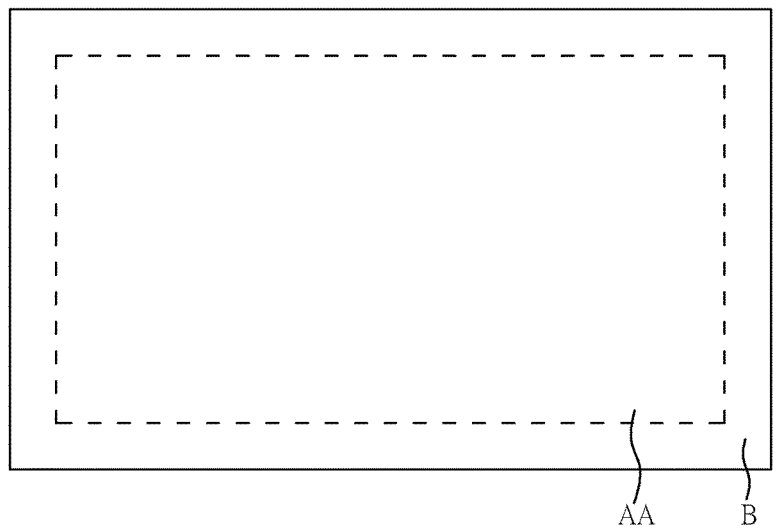
FIG. 1A is a top view of a display device according to Embodiment 1 of the present disclosure.
Figure 1B:
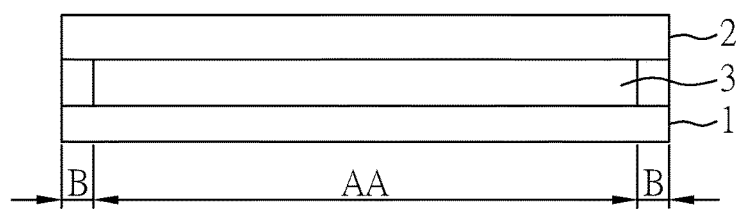
FIG. 1B is a cross-sectional view of the display device according to Embodiment 1 of the present disclosure.

FIG. 1A and FIG. 1B are top and cross-sectional views of the display device of the present embodiment, respectively. Therein, the display device of the present embodiment comprises: a first substrate 1; a second substrate 2 aligned with the first substrate 1; and a display medium layer 3 disposed between the first substrate 1 and the second substrate 2. Therein, display device may comprise: a display region AA; and a periphery region B outside the display region AA. Herein, the periphery region B is an area accommodating wiring, such as wiring of the driving circuit of the gate electrode, while the display region AA is an area comprising pixels distributed thereacross. The display medium may comprise liquid crystals (LC), organic light-emitting diodes (OLED), micro light-emitting diodes (micro LED), quantum dot (QD) or other display elements, and is not limited thereto.

Figure 2A:
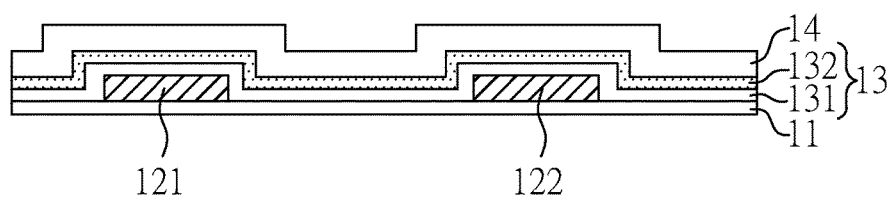
FIG. 2A to FIG. 2G are cross-sectional views of the display device according to Embodiment 1 of the present disclosure showing the flow of elements formed on the substrate.

FIG. 2A to FIG. 2G are cross-sectional views of the display device according to Embodiment 1 of the present disclosure showing the flow of elements formed on the substrate, e.g. on the first substrate 1. First, as shown in FIG. 2A, a substrate 11 is provided and then a first gate electrode 121 and a second gate electrode 122 are formed on the substrate 11. Herein, the substrate 11 may comprise, for example, glass, quartz, plastic or other flexible materials, and the first gate electrode 121 and the second gate electrode 122 may comprise a metal material, such as Cu or Al. Afterward, a gate insulating layer 13 is formed on the substrate 11, the first gate electrode 121, and the second gate electrode 122. In the present embodiment, the gate insulating layer 13 comprises a bottom gate insulating layer 131 and a top gate insulating layer 132. The bottom gate insulating layer 131 is disposed between the substrate 11 and the top gate insulating layer 132, and the bottom gate insulating layer 131 may comprise silicon nitride. The top gate insulating layer 132 may comprise silicon oxide. Then, an amorphous silicon layer 14 is formed on the gate insulating layer 13.

Figure 2B:
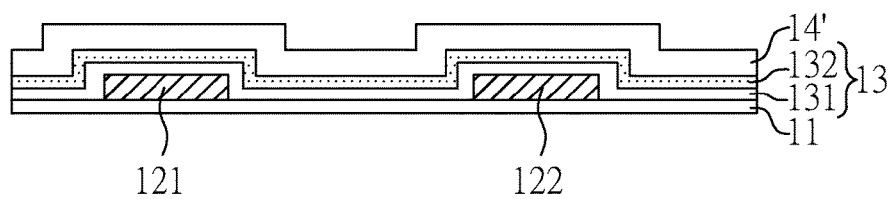
Figure 2C:
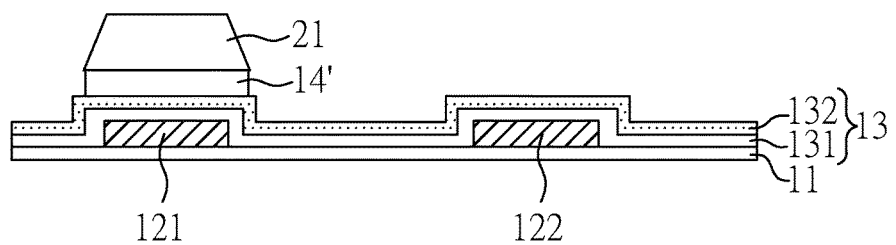
Figure 2D:
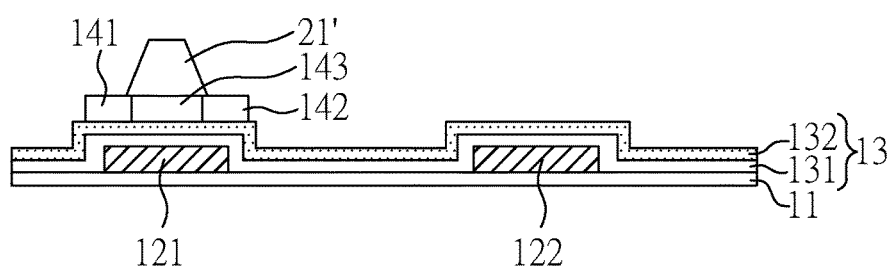

As shown in FIG. 2B, through a laser sintering process and a channel doping process, the amorphous silicon layer 14 is converted into a polysilicon layer 14'. Then, as shown in FIG. 2C, a mask 21 comprising photoresist is used to pattern the polysilicon layer 14'. The formed polysilicon layer 14' corresponds to the first gate electrode 121. Afterward, as shown in FIG. 2D, another mask 21' is used to perform n+ doping or p+ doping process, so as to convert the polysilicon layer 14' of FIG. 2C into a doped source region 141 and a doped drain region 142 in FIG. 2D. Therein, the channel region 143 is disposed between the source region 141 and the drain region 142.

Figure 2E:
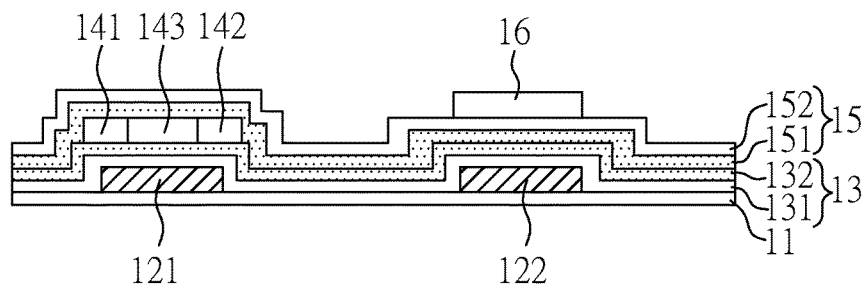

After removal of the mask 21', as shown in FIG. 2E, a first insulating layer 15 is formed on the first active layer (the polysilicon layer 14' as shown in FIG. 2C comprises the source region 141, the drain region 142, and the channel region 143) and the gate insulating layer 13. In the present embodiment, the first insulating layer 15 comprises a first bottom insulating layer 151 and a first top insulating layer 152. The first bottom insulating layer 151 is disposed between the gate insulating layer 13 and the first top insulating layer 152. Therein, the first bottom insulating layer 151 may comprise silicon nitride, and the first top insulating layer 152 may comprise silicon oxide. Afterward, a patterned second active layer 16 is formed on the first insulating layer 15 to correspond to the second gate electrode 122. Therein, the second active layer 16 may be a metal oxide layer, such as an IGZO layer.

Figure 2F:
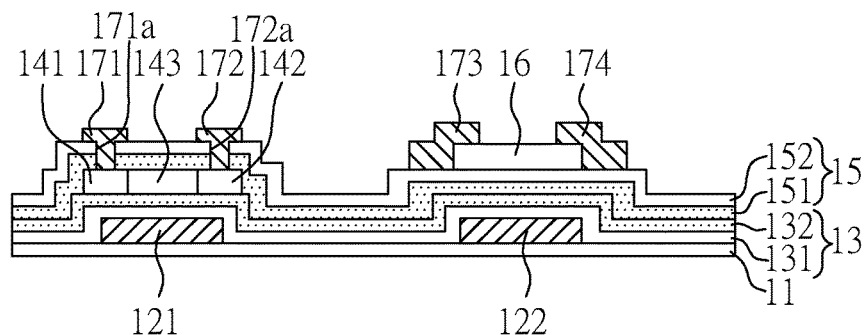

As shown in FIG. 2F, a first source electrode 171, a first drain electrode 172, a second source electrode 173, and a second drain electrode 174 are formed on the first active layer (i.e. the polysilicon layer 14' as shown in FIG. 2C comprises the source region 141, the drain region 142, and the channel region 143), the first insulating layer 15, and the second active layer 16. The first source electrode 171, the first drain electrode 172, the second source electrode 173, and the second drain electrode 174 may comprise a metal material, for example, Cu or Al. Therein, the first source electrode 171 and the first drain electrode 172 are disposed on the first insulating layer 15 and electrically connect to the source region 141 and the drain region 142 of the polysilicon layer 14' (referring to FIG. 2C) through vias 171a, 172a, respectively. The second source electrode 173 and the second drain electrode 174 are disposed on the second active layer 16 and electrically connect to the second active layer 16.

Figure 2G:
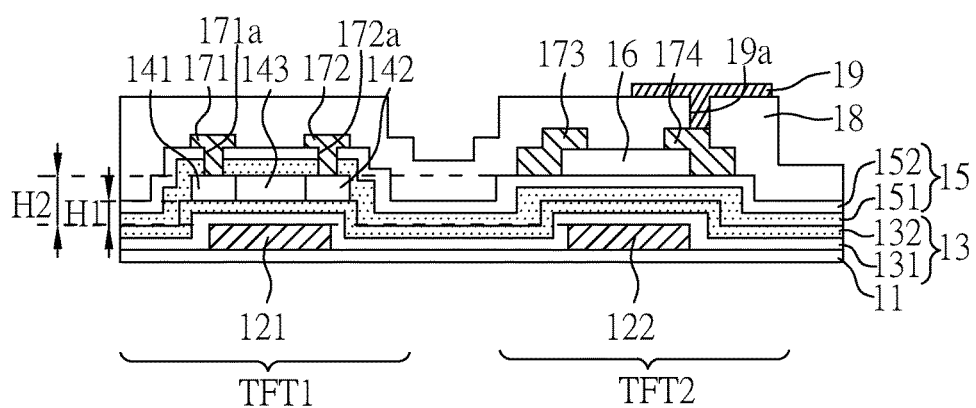

Then, as shown in FIG. 2G, a second insulating layer 18 is formed on the first source electrode 171, the first drain electrode 172, the second source electrode 173, and the second drain electrode 174. Then a pixel electrode 19 is formed on the second insulating layer 18. The pixel electrode 19 electrically connects to the second drain electrode 174 through a contact hole 19a. Herein, the second insulating layer 18 may have a single-layer structure comprising silicon oxide, or have a double-layer structure comprising a lower silicon oxide layer and an upper silicon nitride layer, or have a multi-layer structure including the foregoing double-layer structure and an additional organic material layer stacked thereon. In addition, the pixel electrode 19 may comprise a transparent conducting oxide, such as ITO or IZO.

Through the process described above, elements are formed on the substrate 11. As shown in FIG. 2G, the display device of the present embodiment comprising: a substrate 11; a first gate electrode 121 and a second gate electrode 122 disposed on the substrate 11; a gate insulating layer 13 disposed on the substrate 11, the first gate electrode 121 and the second gate electrode 122; a first active layer (a polysilicon layer 14' as shown in FIG. 2C comprises the source region 141, the drain region 142, and the channel region 143) disposed on the gate insulating layer 13 and corresponding to the first gate electrode 121, wherein the first active layer comprises a polysilicon layer; a first insulating layer 15 disposed on the first active layer and the gate insulating layer 13; a second active layer 16 disposed on the first insulating layer 15 and corresponding to the second gate electrode 122, wherein the second active layer 16 comprises a metal oxide layer (in the present embodiment an IGZO layer); and a first source electrode 171, a first drain electrode 172, a second source electrode 173, and a second drain electrode 174, wherein the first source electrode 171 and the first drain electrode 172 are disposed on the first insulating layer 15 and electrically connect to the source region 141 and the drain region 142 of the first active layer through vias 171a, 172a, respectively, and the second source electrode 173 and the second drain electrode 174 are disposed on the second active layer 16 and electrically connect to the second active layer 16; wherein, the first gate electrode 121, the gate insulating layer 13, the first active layer, the first insulating layer 15, the first source electrode 171, and the first drain electrode 172 form a first transistor TFT1, while the second gate electrode 122, the gate insulating layer 13, the first insulating layer 15, the second active layer 16, the second source electrode 173, and the second drain electrode 174 form a second transistor TFT2.

In the present embodiment, the display device comprises both the first transistor TFT1 comprising a polysilicon layer as the first active layer and the second transistor TFT2 comprising a metal oxide layer as the second active layer 16. Particularly, in the present embodiment, by adjusting the interlayer relationship between the first active layer, the second active layer 16, the gate insulating layer 13, or the first insulating layer 15, the manufacturing process can be simplified and interference between the processes for forming the low-temperature polysilicon transistor (i.e. the first transistor TFT1) and for forming the metal oxide (such as IGZO) transistor (i.e. the second transistor TFT2) can be decreased. Also, structure of the transistors on the substrate 11 of the obtaining display device can be simplified.

Furthermore, a thickness of the insulating layer between the second gate electrode 122 and the second active layer 16 is larger in the second transistor TFT2. In other words, a distance H1 between the first gate electrode 121 and the first active layer (the polysilicon layer 14' as shown in FIG. 2C) in the first transistor TFT1 is smaller than a distance H2 between the second gate electrode 122 and the second active layer 16 in the second transistor TFT2.

In addition, since the first transistor TFT1 and the second transistor TFT2 both are transistors with a bottom gate structure, a shielding layer does not required to be disposed on the substrate 11, thereby simplifying manufacturing process and structure of transistors.

Particularly, in the display device of the present embodiment, as shown in FIG. 2G, the gate insulating layer 13 comprises a bottom gate insulating layer 131 and a top gate insulating layer 132. The bottom gate insulating layer 131 is disposed between the substrate 11 and the top gate insulating layer 132. The bottom gate insulating layer 131 may comprise silicon nitride, and the top gate insulating layer 132 may comprise silicon oxide. In addition, the first insulating layer 15 comprises a first bottom insulating layer 151 and a first top insulating layer 152. The first bottom insulating layer 151 is disposed between the gate insulating layer 13 and the first top insulating layer 152. The first bottom insulating layer 151 may comprise silicon nitride, and the first top insulating layer 152 may comprise silicon oxide. Therefore, in the display device of the present embodiment, the first active layer (the polysilicon layer 14' as shown in FIG. 2C may comprise a polysilicon material, and the polysilicon layer 14' comprises the source region 141, the drain region 142, and the channel region 143) is covered by the first bottom insulating layer 151 comprising silicon nitride, so is able to maintain the properties of a low-temperature polysilicon transistor. The second active layer 16 comprising a metal oxide (such as IGZO) layer is disposed on the first top insulating layer 152 comprising silicon oxide, so is able to maintain the properties of a metal oxide transistor.

In addition, as shown in FIG. 1A, FIG. 1B and FIG. 2G, in the display device of the present embodiment, the first transistor TFT1 is disposed in the periphery region B as a wiring switch, and the second transistor TFT2 is disposed in the display region AA as a switch for the pixel electrode 19. In other embodiment, the first transistor TFT1 and the second transistor TFT2 could both be disposed in the periphery region B or the display region AA.

Embodiment 2

In Embodiment 1, as shown in FIG. 2G, the first gate electrode 121 and the second gate electrode 122 may comprise a same material, which may be Cu or Al. The display device of the present embodiment is structurally similar to Embodiment 1, except that the first gate electrode 121 and the second gate electrode 122 may comprise different structures and different materials.

Figure 3A:
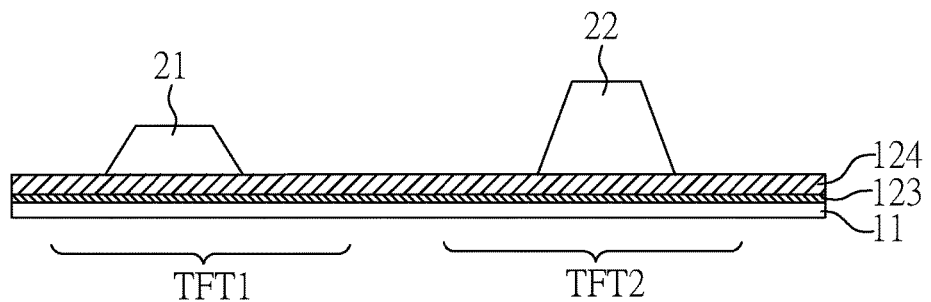
FIG. 3A to FIG. 3E are cross-sectional views of a display device according to Embodiment 2 of the present disclosure showing the flow of elements formed on the substrate.

FIGS. 3A to 3E are cross-sectional views of the display device of the present embodiment showing the first gate electrode and the second gate electrode formed on the substrate. First, as shown in FIG. 3A, a substrate 11 is provided and a first conducting layer 123 and a second conducting layer 124 are successively formed thereon.

Figure 3B:
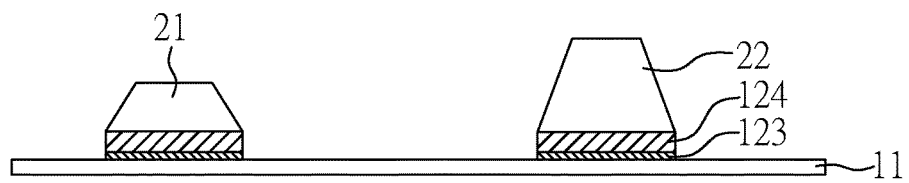
Figure 3C:
Figure 3D:
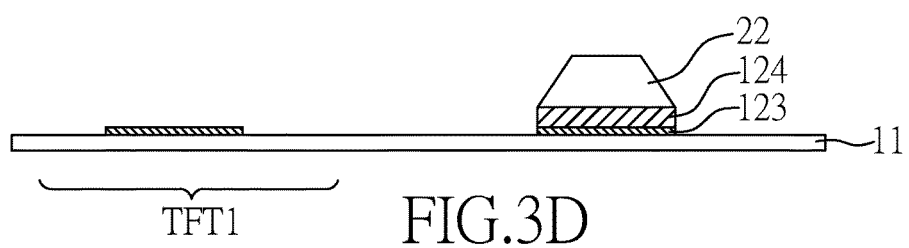
Figure 3E:
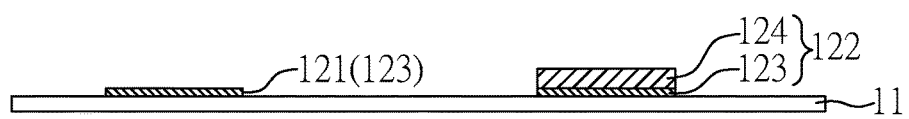

Afterward, by using a half tone mask, for example, a first mask 21 comprising photoresist is formed in the area reserved for the first transistor TFT1, and a second mask 22 comprising photoresist is formed in the area reserved for the second transistor TFT2. Then, as shown in FIG. 3B, the first conducting layer 123 and the second conducting layer 124 are etched. The masks 21, 22 are ashed, as shown in FIG. 3C. Afterward, the second conducting layer 124 in the area reserved for the first transistor TFT1 is removed by etching, as shown in FIG. 3D. At last, the mask 22 is removed so as to form the first gate electrode 121 and the second gate electrode 122 of the present embodiment.

After formation of the first gate electrode 121 and the second gate electrode 122, the rest of the process for making the transistor is similar to that of Embodiment 1 (as shown in FIG. 2A to FIG. 2G), and thus repeated description is omitted herein.

Figure 4:
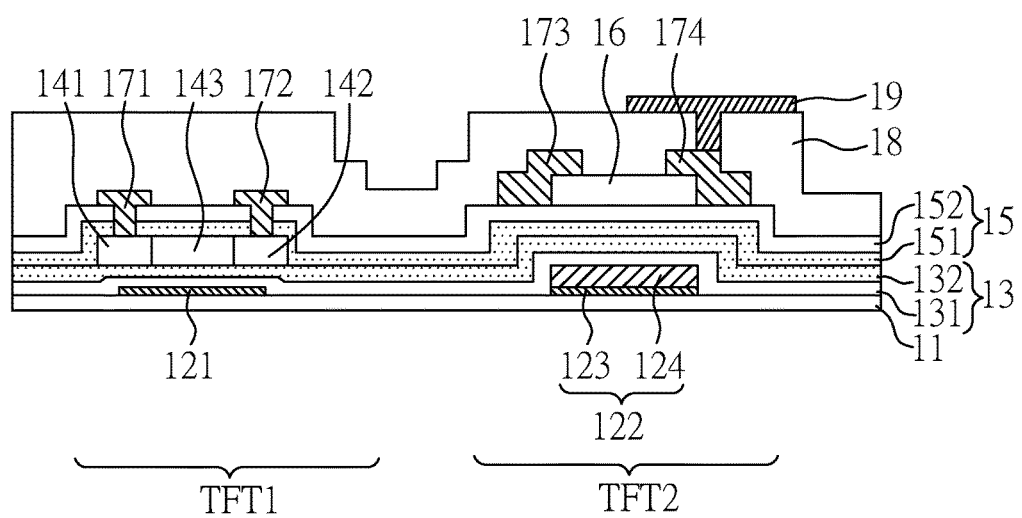
FIG. 4 is a cross-sectional view of the display device according to Embodiment 2 of the present disclosure.

After the process described above, the display device of the present embodiment is obtained. As shown in FIG. 4, the display device of the present embodiment is different from Embodiment 1 because the first gate electrode 121 comprises a first conducting layer 123, and the second gate electrode 122 is formed by successively stacking the first conducting layer 123 and a second conducting layer 124 on the substrate 11. The second conducting layer 124 fully covers the first conducting layer 123. In the present embodiment, the first conducting layer 123 may comprise a thermostable metal material such as Ti, Cr or Mo or a transparent conducting oxide such as ITO or IZO. This is to prevent damage of the first gate electrode 121 from the subsequent laser process for forming polysilicon. The second conducting layer 124 may similarly comprise a thermostable metal material such as Ti, Cr or Mo or a transparent conducting oxide, or it may comprise a metal material such as Cu or Al.

Thus, in the present embodiment, since the first gate electrode 121 is formed by the first conducting layer 123, a thickness can be reduced so that the first gate electrode 121 is thinner than the second gate electrode 122. Meanwhile, since the first conducting layer 123 may comprise a thermostable metal material or a transparent conducting oxide, the first gate electrode 121 is protected from being damaged by the subsequent laser process.

Embodiment 3

Figure 5A:
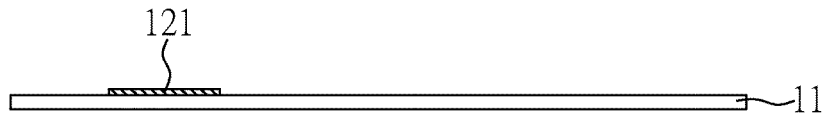
FIG. 5A to FIG. 5H are cross-sectional views of a display device according to Embodiment 3 of the present disclosure showing the flow of elements formed on the substrate.

The display device of the present embodiment is different from Embodiment 1 due to different elements on the substrate 11. FIG. 5A to FIG. 5H are cross-sectional views of a display device according to the present embodiment showing the flow of elements formed on the substrate. First, as shown in FIG. 5A, a substrate 11 is provided and a first gate electrode 121 is formed thereon. Herein, the substrate 11 may comprise, for example, glass, quartz, plastic, or other flexible materials, and the first gate electrode 121 may comprise a thermostable metal material such as Ti, Cr or Mo, or a transparent conducting oxide.

Figure 5B:
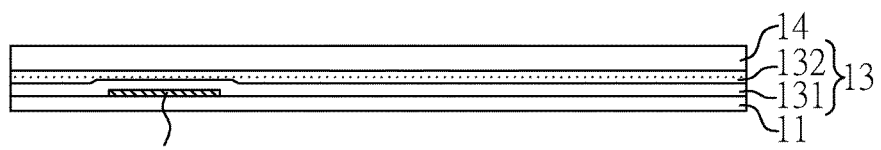

As shown in FIG. 5B, a gate insulating layer 13 is formed on the substrate 11 and the first gate electrode 121. In the present embodiment, the gate insulating layer 13 comprises a bottom gate insulating layer 131. and a top gate insulating layer 132. The bottom gate insulating layer 131 is disposed between the substrate 11 and the top gate insulating layer 132. The bottom gate insulating layer 131 may comprise silicon nitride, and the top gate insulating layer 132 may comprise silicon oxide. Afterward, an amorphous silicon layer 14 is formed on the gate insulating layer 13.

Figure 5C:
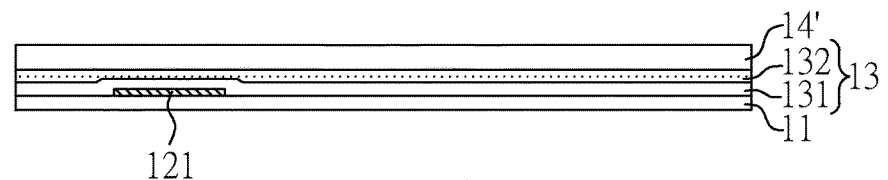
Figure 5D:
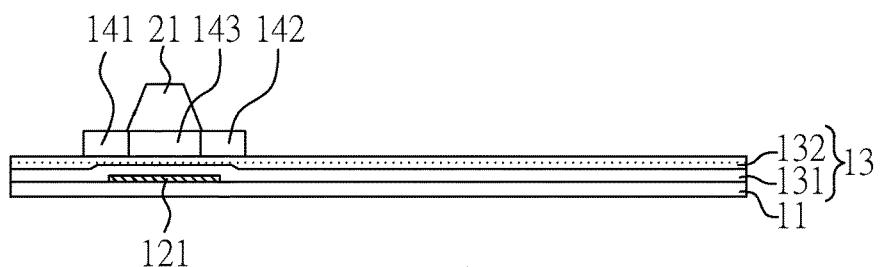

As shown in FIG. 5C, through a laser sintering process and a channel doping process, the amorphous silicon layer 14 is converted into the polysilicon layer 14'. Then, as shown in FIG. 5D, the polysilicon layer 14' is patterned using a mask 21 comprising photoresist. The polysilicon layer 14' is disposed corresponding to the first gate electrode 121. Then the mask 21 (may be the one used to pattern the polysilicon layer 14', or another mask 21) is used to perform n+ doping or p+ doping in the source region 141 and the drain region 142, so the polysilicon layer 14' could comprise the source region 141, the drain region 142 and the channel region 143, as shown in FIG. 5D.

Figure 5E:
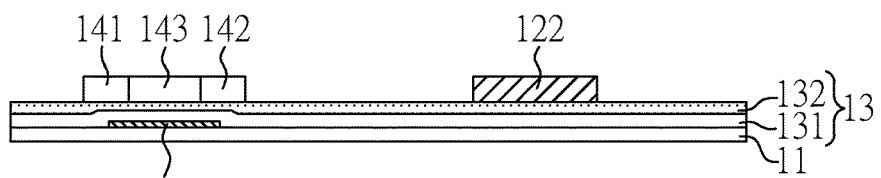
Figure 5F:
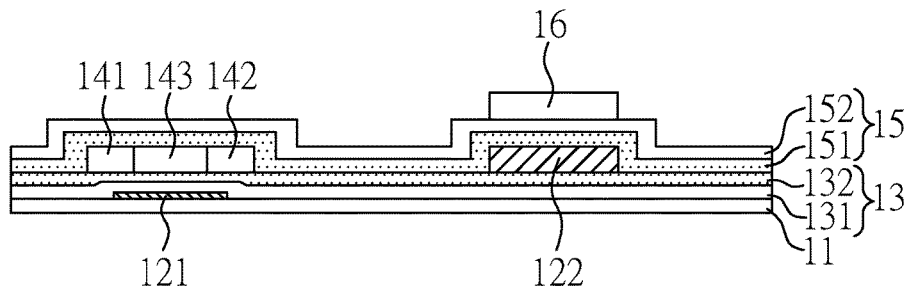

After removal of the mask 21, as shown in FIG. 5E, a second gate electrode 122 is formed on the gate insulating layer 13 using a metal material such as Cu or Al. Then, as shown in FIG. 5F, a first insulating layer 15 is formed on the source region 141, the drain region 142, the channel region 143 and the second gate electrode 122. In the present embodiment, the first insulating layer 15 comprises a first bottom insulating layer 151 and a first top insulating layer 152. The first bottom insulating layer 151 is disposed between the gate insulating layer 13 and the first top insulating layer 152. Therein, the first bottom insulating layer 151 may comprise silicon nitride, and the first top insulating layer 152 may comprise silicon oxide. Afterward, a second active layer 16 is formed on the first insulating layer 15 to correspond to the second gate electrode 122. Therein, the second active layer 16 may be a metal oxide layer, such as an IGZO layer.

Figure 5G:
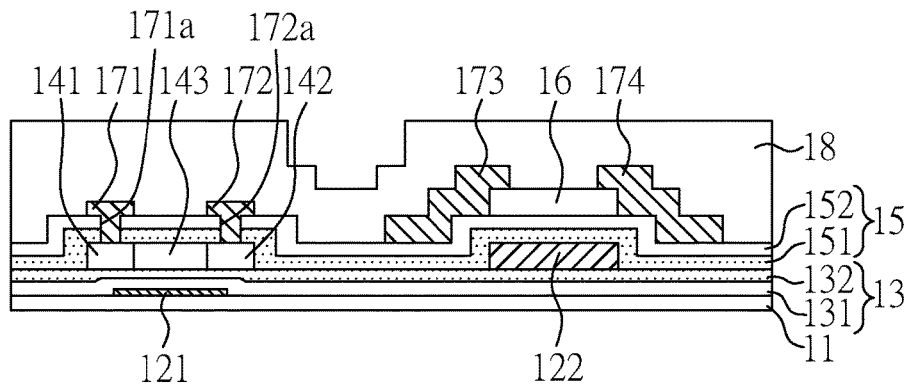
Figure 5H:
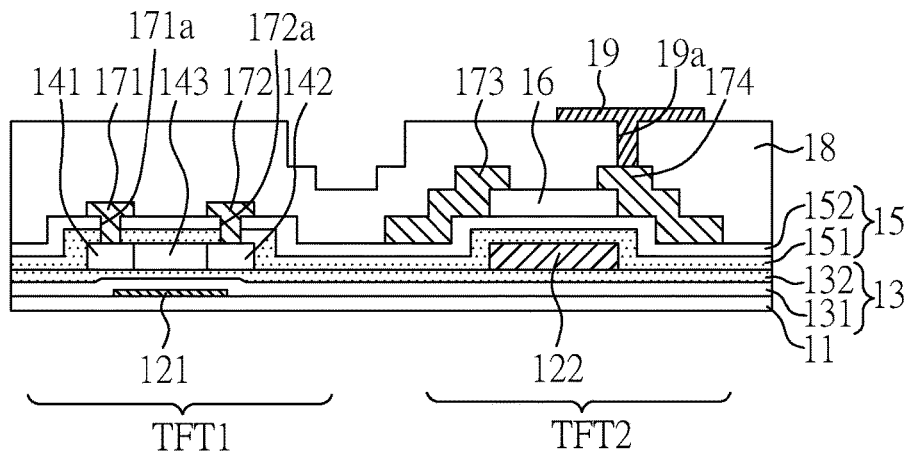

As shown in FIG. 5G and FIG. 5H, the first source electrode 171, the first drain electrode 172, the second source electrode 173, the second drain electrode 174, a second insulating layer 18, and a pixel electrode 19 are formed using the process similar to that of Embodiment 1, and repeated description is omitted herein.

Through the process described above, formation of the elements on the substrate 11 is achieved. As shown in FIG. 5H, the display device of the present embodiment comprises: a substrate 11; a first gate electrode 121 disposed on the substrate 11; a gate insulating layer 13 disposed on the substrate 11 and the first gate electrode 121; a first active layer (a polysilicon layer comprising a source region 141, a drain region 142 and a channel region 143) disposed on the gate insulating layer 13 and corresponding to the first gate electrode 121, wherein the first active layer is a polysilicon layer; a second gate electrode 122 disposed on the gate insulating layer 13; a first insulating layer 15 disposed on the first active layer and the second gate electrode 122; a second active layer 16 disposed on the first insulating layer 15 and corresponding to the second gate electrode 122, wherein the second active layer 16 is a metal oxide layer (in the present embodiment, an IGZO layer); and a first source electrode 171, a first drain electrode 172, a second source electrode 173, and a second drain electrode 174, wherein the first source electrode 171 and the first drain electrode 172 are disposed on the first insulating layer 15 and electrically connect to the source region 141 and the drain region 142 of the first active layer through vias 171a, 172a, respectively, while the second source electrode 173 and the second drain electrode 174 are disposed on the second active layer 16 and electrically connect to the second active layer 16. Therein, the first gate electrode 121, the gate insulating layer 13, the first active layer (the polysilicon layer 14', referring to FIG. 5C), the first insulating layer 15, the first source electrode 171, and the first drain electrode 172 form a first transistor TFT1, and the second gate electrode 122, the first insulating layer 15, the second active layer 16, the second source electrode 173, and the second drain electrode 174 form a second transistor TFT2.

Similar to the display device of Embodiment 1, the display device of the present embodiment comprises both the first transistor TFT1 comprising a polysilicon layer as the first active layer and the second transistor TFT2 comprising a metal oxide layer as the second active layer 16. The main structural difference of the present embodiment from Embodiment 1 is that, in the present embodiment, the second gate electrode 122 is formed on the gate insulating layer 13 (as shown in FIG. 5H), while in Embodiment 1, the second gate electrode 122 is formed under the gate insulating layer 13 (as shown in FIG. 2G). Another structural difference between the present embodiment and Embodiment 1 is that, in the present embodiment, the first gate electrode 121 may comprise a thermostable metal material, such as Ti, Cr or Mo, or a transparent conducting oxide to protect the first gate electrode 121 from being damaged by the laser process and reduce the thickness of the first gate electrode 121.

Embodiment 4

Figure 6A:
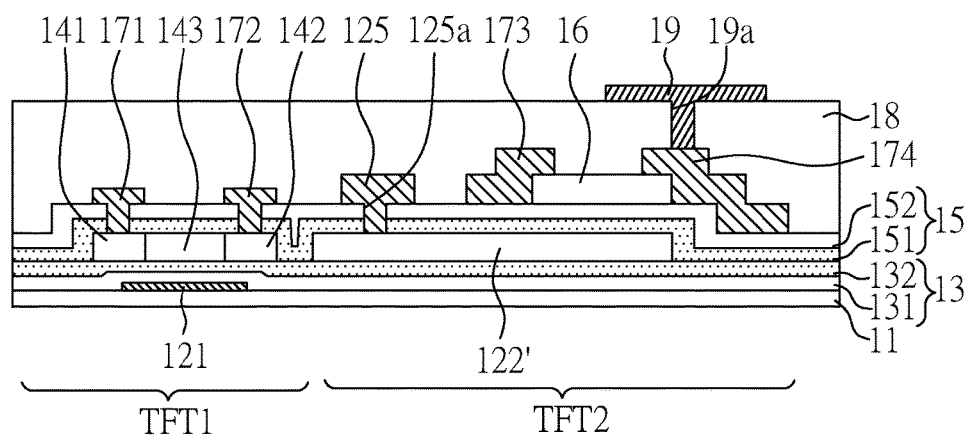
FIG. 6A is a cross-sectional view of a display device according to Embodiment 4 of the present disclosure.
Figure 6B:
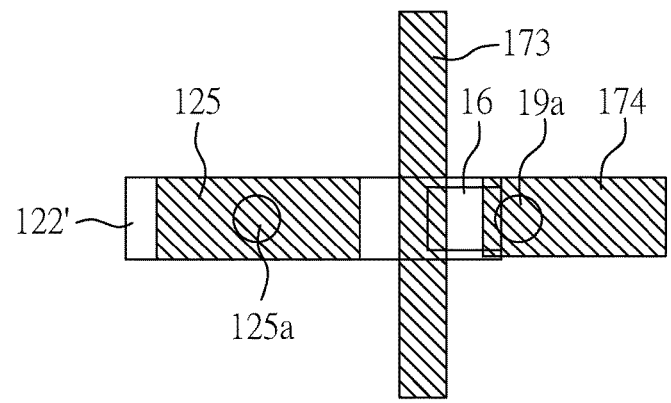
FIG. 6B is a top view of the display device according to Embodiment 4 of the present disclosure showing some layers in the second transistor.

FIG. 6A is a cross-sectional view of a display device according to the present embodiment. FIG. 6B is a top view showing some layers in the second transistor, in which the relationship among the second gate electrode 122', the scan line 125, the second active layer 16, the second source electrode 173, and the second drain electrode 174 is illustrated. The display device of the present embodiment is similar to Embodiment 3, except for the following differences.

In Embodiment 3, the second gate electrode 122 may comprise a metal material such as Cu or Al, as shown in FIG. 5H. However, in the present embodiment, the second gate electrode 122' may comprise polysilicon. More specifically, during formation of the first active layer (i.e. the polysilicon layer comprising the source region 141, the drain region 142, and the channel region 143), polysilicon is further disposed in the area reserved for the second transistor TFT2 and is doped into a n-type transistor, so as to form the second gate electrode 122' of the present embodiment.

Moreover, in the present embodiment, when the first source electrode 171, the first drain electrode 172, the second source electrode 173, and the second drain electrode 174 are formed, a scan line 125 is also formed on the first insulating layer 15. The scan line 125 electrically connects to the second gate electrode 122' through a via 125a.

Embodiment 5

The display device of the present embodiment is structurally similar to Embodiment 1, except that structure and material of the second gate electrode 122 is different.

Figure 7A:
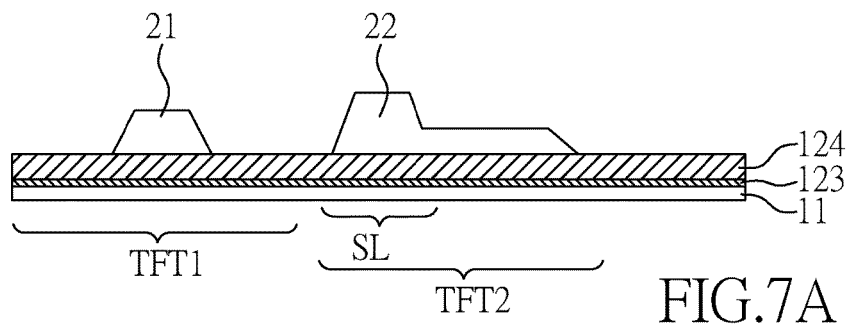
FIG. 7A to FIG. 7G are cross-sectional views of a display device according to Embodiment 5 of the present disclosure showing the flow of elements formed on the substrate.
Figure 7B:
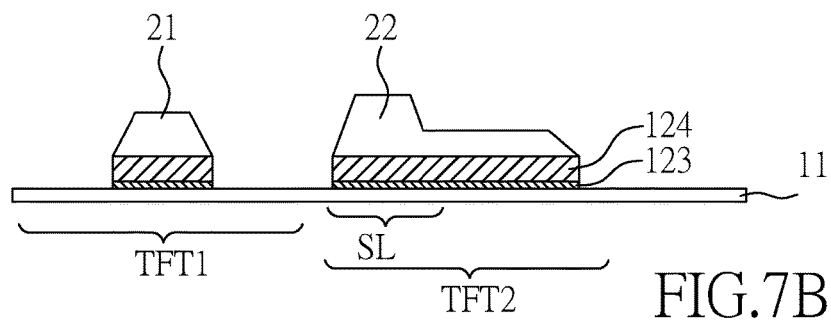
Figure 7C:
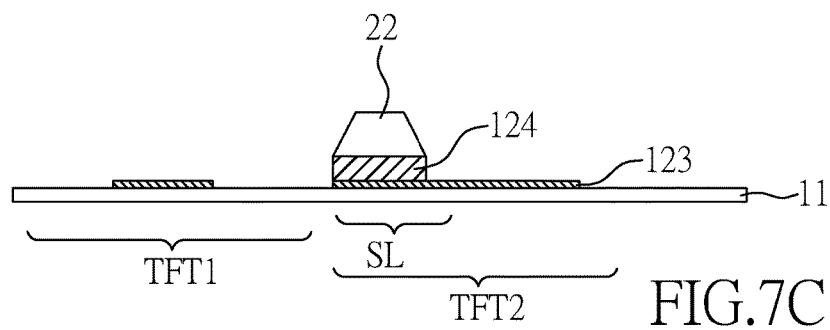
Figure 7D:
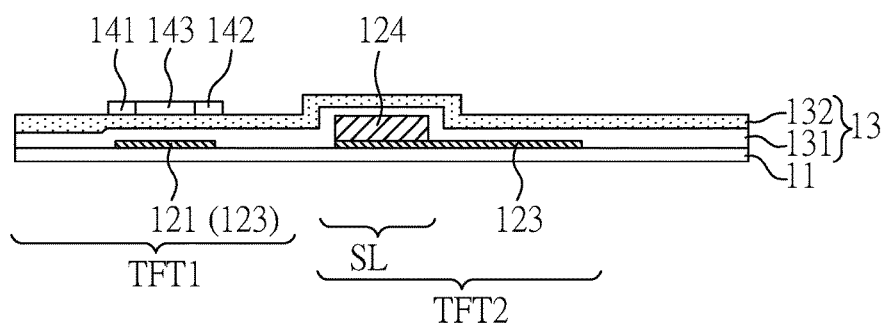

FIGS. 7A to 7G are cross-sectional views of a display device according to the present embodiment showing the flow of elements formed on the substrate. First, as shown in FIG. 7A, a substrate 11 is provided and a first conducting layer 123 and a second conducting layer 124 are successively formed thereon. Afterward, by using a half tone mask, a first mask 21 comprising photoresist is formed in the area reserved for the first transistor TFT1, and a second mask 22 is formed in the area reserved for the second transistor TFT2 and the scan line SL. Then, as shown in FIG. 7B, the first conducting layer 123 and the second conducting layer 124 are etched. As shown in FIG. 7C, the masks 21, 22 are ashed and the second conducting layer 124 in the areas reserved for the first transistor TFT1 and the second transistor TFT2 is removed by etching. At last, the mask 22 is removed, the first gate electrode 121 and the second gate electrode (the first conducting layer 123 and the second conducting layer 124 disposed in the area of the second transistor TFT2) of the present embodiment are obtained, as shown in FIG. 7D.

In the present embodiment, the first gate electrode 121 comprises the first conducting layer 123, and the second gate electrode is formed by successively stacking the first conducting layer 123 and the second conducting layer 124 on the substrate 11. The second conducting layer 124 partially covers the first conducting layer 123. Therein, the second gate electrode in the area in the second transistor TFT2 is formed by the first conducting layer 123, and the second gate electrode in the area of the scan line SL is formed by the first conducting layer 123 and the second conducting layer 124. The first conducting layer 123 may comprise Ti, Cr, Mo or a transparent conducting oxide, and the second conducting layer 124 may comprise Cu, Al, Ti, Cr, Mo or a transparent conducting oxide. In other embodiment, the first conducting layer 123 and the second conducting layer 124 of the second gate electrode could be a same material.

Figure 7E:
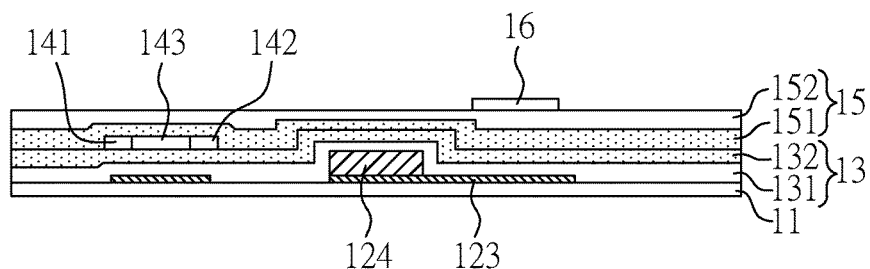

As shown in FIG. 7D and FIG. 7E, after formation of the first gate electrode 121 and the second gate electrode, the first active layer (the polysilicon layer comprising the source region 141, the drain region 142, and the channel region 143), the first insulating layer 15, and the second active layer 16 are successively formed using the process similar to that of Embodiment 1. Therein, the second conducting layer 124 partially covers first conducting layer 123, and the area of the first conducting layer 123 not covered by the second conducting layer 124 corresponds to the second active layer 16.

Figure 7F:
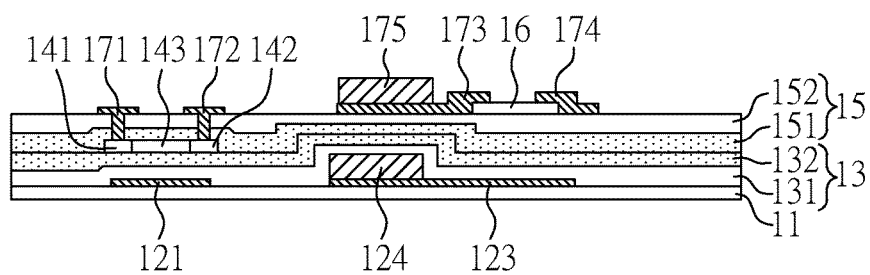

Afterward, as shown in FIG. 7F, the first source electrode 171, the first drain electrode 172, the second source electrode 173, and the second drain electrode 174 are formed using the process similar to that of Embodiment 1 but the material and structure are different. In the present embodiment, the first source electrode 171, the first drain electrode 172, the second source electrode 173, and the second drain electrode 174 are formed by a third conducting layer comprising Ti, Cr, Mo or a transparent conducting oxide. A fourth conducting layer 175 may comprise, for example, Cu or Al, and partially covers at least one of the second source electrode 173 and the second drain electrode 174. In the present embodiment, the fourth conducting layer 175 is formed on the second source electrode 173 and acts as a data line.

Figure 7G:
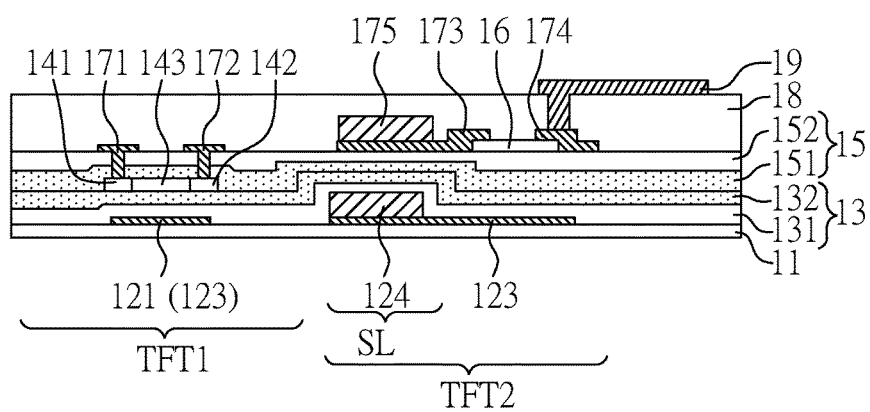

At last, as shown in FIG. 7G, by using the process similar to that of Embodiment 1, the second insulating layer 18 and the pixel electrode 19 are formed, thereby formation of the elements on the present embodiment substrate 11 is completed.

Embodiment 6

Figure 8A:
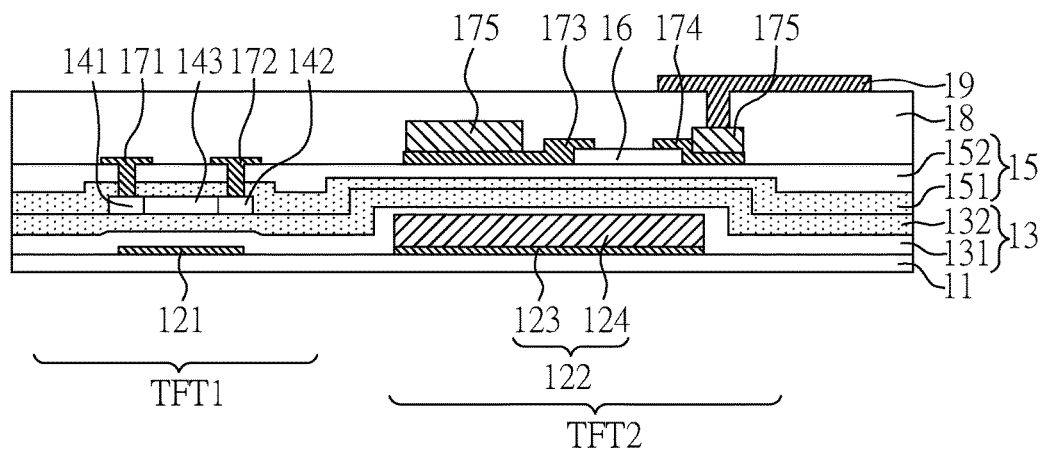
FIG. 8A is a cross-sectional view of a display device according to Embodiment 6 of the present disclosure.
Figure 8B:
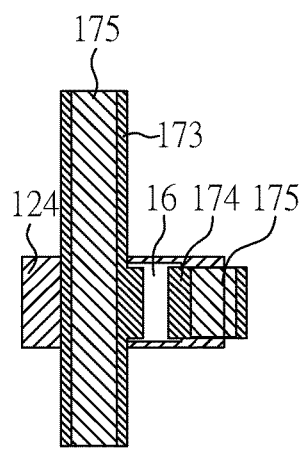
FIG. 8B is a top view of the display device according to Embodiment 6 of the present disclosure showing some layers in the second transistor.

FIG. 8A is a cross-sectional view of the display device of the present embodiment and FIG. 8B is a top view showing some layers in the second transistor, in which relationship among the second conducting layer 124, the second active layer 16, the second source electrode 173, the second drain electrode 174, and the fourth conducting layer 175 of the second gate electrode is illustrated. The present embodiment is similar to Embodiment 5 in terms of manufacturing process and configuration, except for the following differences.

First, in the area of the second transistor TFT2, the second conducting layer 124 fully covers the first conducting layer 123. This may be achieved using the process as explained in FIG. 3A to FIG. 3E associated with Embodiment 2. In addition, in the area of the second transistor TFT2, a fourth conducting layer 175 may comprise, for example, Cu or Al, partially covers the second source electrode 173 as described in Embodiment 5, and further partially covers the second drain electrode 174.

Embodiment 7

Figure 9:
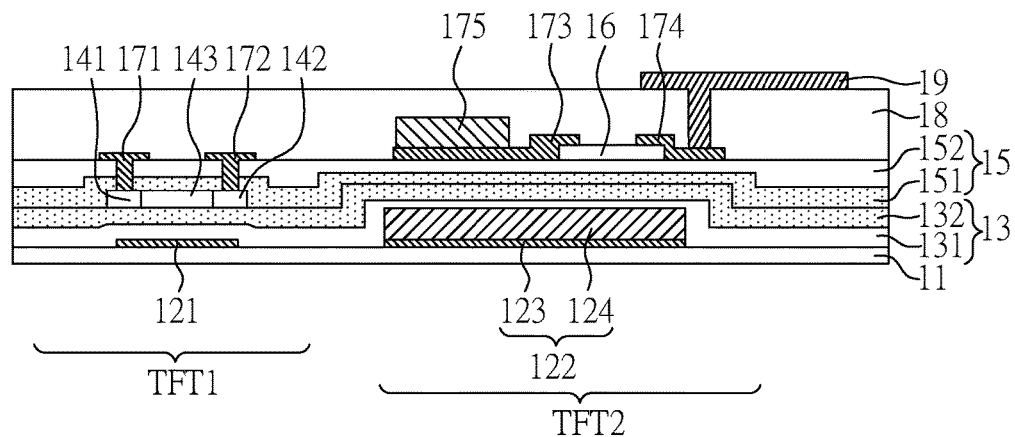
FIG. 9 is a cross-sectional view of a display device according to Embodiment 7 of the present disclosure.

FIG. 9 is a cross-sectional view of a display device according to the present embodiment. The present embodiment and Embodiment 6 are similar in terms of manufacturing process and configuration, except that the fourth conducting layer 175 is formed on the second source electrode 173 and not on the second drain electrode 174.

Embodiment 8

Figure 10:
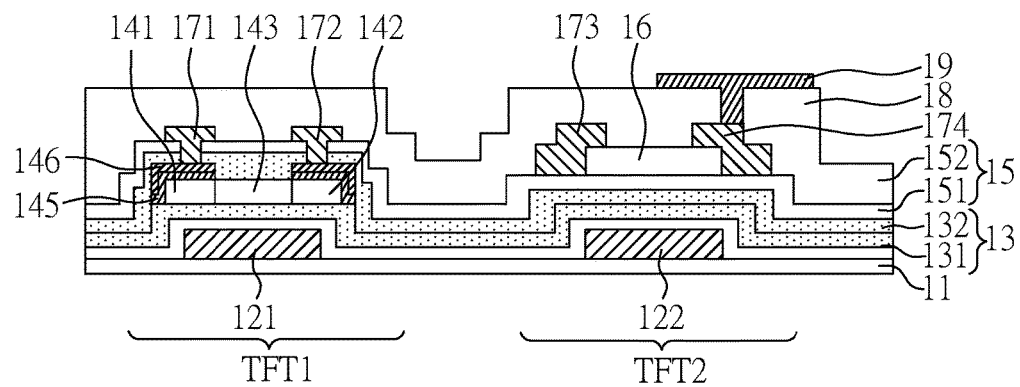
FIG. 10 is a cross-sectional view of a display device according to Embodiment 8 of the present disclosure.

FIG. 10 is a cross-sectional view of a display device according to the present embodiment. The present embodiment is similar to Embodiment 1 in terms of manufacturing process and configuration, except for the following differences.

In the display device of the present embodiment, on the first transistor TFT1, the first active layer may further comprise an amorphous silicon layer 145 and a doped amorphous silicon layer 146. The amorphous silicon layer 145 and the doped amorphous silicon layer 146 are successively disposed in the source region 141 and drain region 142 of the polysilicon layer. Thereby, leakage current of the low-temperature polysilicon transistor can be minimized.

Embodiment 9

Figure 11:
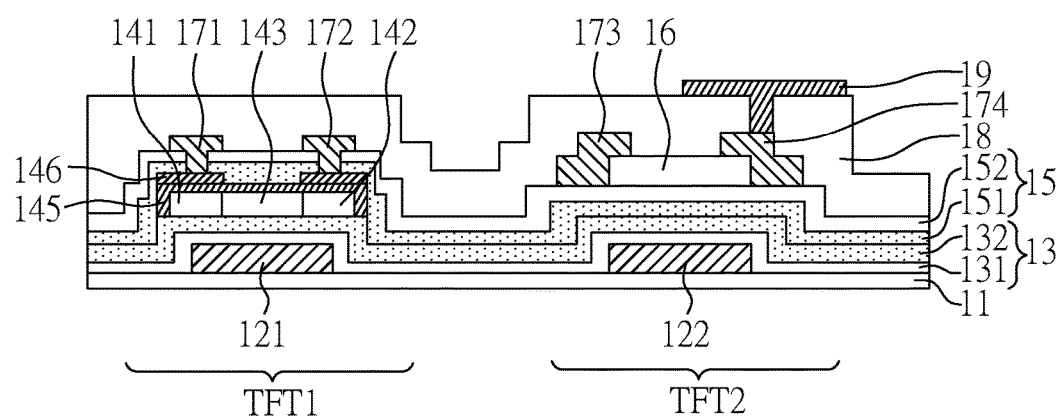
FIG. 11 is a cross-sectional view of a display device according to Embodiment 9 of the present disclosure.

FIG. 11 is a cross-sectional view of a display device according to the present embodiment. The present embodiment is similar to Embodiment 8 in terms of manufacturing process and configuration, except that the amorphous silicon layer 145 is further disposed in the channel region 143 of the polysilicon layer.

The amorphous silicon layer 145 and the doped amorphous silicon layer 146 of any one of Embodiments 8 and 9 may be disposed on the display device of Embodiment 1, and may be also used in the display device of any one of Embodiments 1 to 7.

In addition, a display device made as described in any of the Embodiments of the present disclosure as described previously may be integrated with a touch panel to form a touch display device. Moreover, a display device or touch display device made as described in any of the Embodiments of the present disclosure as described previously may be applied to any electronic devices known in the art that need a display screen, such as displays, mobile phones, laptops, video cameras, still cameras, music players, mobile navigators, TV sets, and other electronic devices that display images.

While the above Embodiments are provided for illustrating the concept of the present disclosure, it is to be understood that these Embodiments in no way limit the scope of the present disclosure which is defined solely by the appended claims.

What is claimed is:

1. A display device, comprising:
  a substrate;
  a first gate electrode and a second gate electrode disposed on the substrate, wherein the first gate electrode is formed by a first conducting layer, and the second gate electrode is formed by stacking the first conducting layer and a second conducting layer on the substrate;
  a gate insulating layer disposed on the substrate, the first gate electrode and the second gate electrode;
  a first active layer disposed on the gate insulating layer and corresponding to the first gate electrode, wherein the first active layer comprises a polysilicon layer;
  a first insulating layer disposed on the first active layer and the gate insulating layer, and the first insulating layer comprising a first bottom insulating layer and a first top insulating layer;
  a second active layer disposed on the first insulating layer and corresponding to the second gate electrode, wherein the second active layer comprises a metal oxide layer;
  a first source electrode, a first drain electrode, a second source electrode and a second drain electrode, wherein the first source electrode and the first drain electrode are disposed on the first insulating layer and electrically connect to the first active layer, and the second source electrode and the second drain electrode are disposed on the second active layer and electrically connect to the second active layer; and
  a fourth conducting layer, wherein the fourth conducting layer partially covers at least one of the second source electrode and the second drain electrode,
  wherein, the first gate electrode, the gate insulating layer, the first active layer, the first insulating layer, the first source electrode, and the first drain electrode form a first transistor, the second gate electrode, the gate insulating layer, the first insulating layer, the second active layer, the second source electrode, and the second drain electrode form a second transistor; and
  a display medium layer disposed on the substrate.

2. The display device of claim 1, wherein a distance between the first gate electrode and the first active layer is smaller than a distance between the second gate electrode and the second active layer.

3. The display device of claim 1, wherein the display device comprises a display region and a periphery region outside the display region, the first transistor is disposed in the periphery region, and the second transistor is disposed in the display region.

4. The display device of claim 1, wherein the gate insulating layer comprises a bottom gate insulating layer and a top gate insulating layer, the bottom gate insulating layer is disposed between the substrate and the top gate insulating layer, the bottom gate insulating layer comprises silicon nitride, and the top gate insulating layer comprises silicon oxide.

5. The display device of claim 1, wherein the first bottom insulating layer is disposed between the gate insulating layer and the first top insulating layer, the first bottom insulating layer comprises silicon nitride, and the first top insulating layer comprises silicon oxide.

6. The display device of claim 1, wherein the first gate electrode and the second gate electrode comprise a same material.

7. The display device of claim 1, wherein the second conducting layer partially covers the first conducting layer, and an area of the first conducting layer not covered by the second conducting layer corresponds to the second active layer.

8. The display device of claim 1, wherein a thickness of the first gate electrode is smaller than a thickness of the second gate electrode.

9. The display device of claim 1, wherein the polysilicon layer comprises a source region, a drain region and a channel region, the channel region is disposed between the source region and the drain region, and the source region and the drain region electrically connect to the first source electrode and the first drain electrode, respectively.

10. The display device of claim 1, wherein the first active layer further comprises an amorphous silicon layer disposed on the polysilicon layer.

11. The display device of claim 10, wherein the amorphous silicon layer comprises a doped region and a non-doped region, the doped region is disposed on the source region and the drain region, and the non-doped region is disposed on the channel region.

12. A display device, comprising:
- a substrate;
- a first gate electrode and a second gate electrode disposed on the substrate, wherein the first gate electrode is formed by a first conducting layer, the second gate electrode is formed by stacking the first conducting layer and a second conducting layer on the substrate, and the second conducting layer partially covers the first conducting layer;
- a gate insulating layer disposed on the substrate, the first gate electrode and the second gate electrode;
- a first active layer disposed on the gate insulating layer and corresponding to the first gate electrode, wherein the first active layer comprises a polysilicon layer;
- a first insulating layer disposed on the first active layer and the gate insulating layer, and the first insulating layer comprising a first bottom insulating layer and a first top insulating layer;
- a second active layer disposed on the first insulating layer and corresponding to the second gate electrode, wherein the second active layer comprises a metal oxide layer; and
- a first source electrode, a first drain electrode, a second source electrode and a second drain electrode, wherein the first source electrode and the first drain electrode are disposed on the first insulating layer and electrically connect to the first active layer, and the second source electrode and the second drain electrode are disposed on the second active layer and electrically connect to the second active layer, wherein an area of the first conducting layer not covered by the second conducting layer corresponds to the second active layer, wherein, the first gate electrode, the gate insulating layer, the first active layer, the first insulating layer, the first source electrode, and the first drain electrode form a first transistor, the second gate electrode, the gate insulating layer, the first insulating layer, the second active layer, the second source electrode, and the second drain electrode form a second transistor; and a display medium layer disposed on the substrate.

13. The display device of claim 12, wherein a distance between the first gate electrode and the first active layer is smaller than a distance between the second gate electrode and the second active layer.

14. The display device of claim 12, wherein the display device comprises a display region and a periphery region outside the display region, the first transistor is disposed in the periphery region, and the second transistor is disposed in the display region.

15. The display device of claim 12, wherein the gate insulating layer comprises a bottom gate insulating layer and a top gate insulating layer, the bottom gate insulating layer is disposed between the substrate and the top gate insulating layer, the bottom gate insulating layer comprises silicon nitride, and the top gate insulating layer comprises silicon oxide.

16. The display device of claim 12, wherein a thickness of the first gate electrode is smaller than a thickness of the second gate electrode.

17. The display device of claim 12, wherein the first active layer further comprises an amorphous silicon layer disposed on the polysilicon layer.

* * * * *